United States Patent [19]

Laskoski

[11] Patent Number: 5,428,554
[45] Date of Patent: Jun. 27, 1995

[54] HIERARCHICAL GRAPH ANALYSIS METHOD AND APPARATUS

[75] Inventor: Gary M. Laskoski, Goshen, N.Y.

[73] Assignee: International Business Machines Corporation, Armonk, N.Y.

[21] Appl. No.: 939,815

[22] Filed: Sep. 3, 1992

[51] Int. Cl.⁶ ............................................. G06F 15/20
[52] U.S. Cl. .................................. 364/550; 395/160; 395/161; 395/162
[58] Field of Search ............... 395/160, 161, 140, 700, 395/100; 364/550

[56] References Cited

U.S. PATENT DOCUMENTS

| | | | |
|---|---|---|---|
| 4,613,946 | 9/1986 | Forman | 364/518 |
| 4,731,606 | 3/1988 | Bantz et al. | 340/709 |
| 4,800,510 | 1/1989 | Vinberg et al. | 364/521 |
| 4,852,019 | 7/1989 | Vinberg et al. | 364/521 |
| 5,021,947 | 6/1991 | Campbell et al. | 364/200 R |
| 5,129,046 | 7/1992 | Tanabe et al. | 395/100 R |

OTHER PUBLICATIONS

National Bureau of Standards, Dec. 1982 (NBS SP 500-99), "Structured Testing: A Software Testing Methodology Using Cyclomatic Complexity Metric", by T. J. McCabe.

ACM 1989, "Edge Concentration: A Method for Clustering Direct Graphs", by Frances J. Newbery, pp. 76-85.

IEEE, 1988 "An Environment for Understanding Programs", by Lenore Cleveland, pp. 500-509.

IBM Research Report 1988, "PUNS: A Program Understanding Support Environment", pp. 1-28 by Lenore Cleveland.

IBM Patent Application (GE9-91-016) SN 07/933,425, filed Aug. 21, 1992, "Graphics Display Tool", by M. Szardenings.

*Primary Examiner*—Emanuel T. Voeltz
*Assistant Examiner*—Kamini S. Shah
*Attorney, Agent, or Firm*—Lynn L. Augspurger; William B. Porter

[57] ABSTRACT

A source computer program is analyzed and transformed into a directed graph file comprising a function list file, listing all functions (nodes) in the directed graph file, and a function call list file, listing all calls between said functions (arcs). A hierarchical graph analysis (HGA) function: calculates a "node reach" for each node—comprising the set of all nodes which may be reached from the node in question; produces a node display threshold value—indicating the maximum node reach to be displayed; and uses the node display threshold value to produce an HGA directed graph—comprising only those nodes to be displayed. Finally, a display function displays the HGA directed graph. Optionally, the node display threshold value may be modified after the display, and a new HGA directed graph produced and displayed.

15 Claims, 8 Drawing Sheets

FIG. 7

SAMPLE SOURCE
CODE PROGRAM FILE
701

```
MAIN()                        /*START FUNCTION*/
{ SUM = ADD(1,2);
  PRINT("THE SUM IS SUM");
}                             /*END FUNCTION*/

ADD(INT A, INT B)             /*START FUNCTION*/
{ SUM = A+B;
}                             /*END FUNCTION*/

PRINT(STRING)                 /*START FUNCTION*/
{ SCREEN LOCATION = STRING;
}                             /*END FUNCTION*/
```

DIRECTED GRAPH
702

| FUNCTION LIST |
|---|
| PROGRAM FUNCTION (MAIN)<br>PROGRAM FUNCTION (ADD)<br>PROGRAM FUNCTION (PRINT) |
| FUNCTION CALL LIST |
| PROGRAM FUNCTION CALL (MAIN,ADD)<br>PROGRAM FUNCTION CALL (MAIN,PRINT) |

703 — (function list)
704 — (function call list)

HIERARCHICAL GRAPH ANALYSIS METHOD AND APPARATUS

FIELD OF THE INVENTION

This invention relates to systems for analyzing the structure of computer programs. More particularly, it relates to computer systems and processes for simplified displays of computer program structure.

BACKGROUND ART

The purpose of a program understanding tool is to help improve a programmer's comprehension of an existing software system. Toward this goal, some program understanding tools will present certain calling relationships observed in the software system, such as control flow and inter-function calls, to the programmer in a graphical format. The major benefit of displaying this information as a graph is that the calling relationships between the nodes are readily visible. This representation allows the programmer to see, at a glance, how the nodes of the graph are hierarchically related, how certain nodes may be reached, and how each node in the graph relates to the rest of the nodes in the graph. One problem with this technique is that, as the complexity of the displayed graph increases, the utility of the graph to the end user is diminished. In fact for extremely complex graphs, this problem can become so severe that the displayed graph is essentially useless for the purpose of program understanding.

One of the most important factors that determines the complexity of a graph is the relationship between the number of nodes and arcs it contains. One measure of this complexity was proposed by the U.S. National Bureau of Standards (NBS Special Publication 500-99, issued December 1982) as the "cyclomatic number". This is used for measuring the complexity of a graph. This cyclomatic complexity measure may be determined for a given graph, G, by performing the following calculation:

CyclomaticComplexity(G)=NumArcs(G)−NumNodes(G)+2(NumComponents)

"NumComponents" in the previous equation is equal to the number of disconnected subcomponents that comprise the graph G. Examples of graphs with a complexity number of up to 12 appear to be usable for the purposes of program understanding. However, examples with a complexity of 47 appears to be pushing the limits of usability. In this case, the relationships between the nodes in the graph may become hidden by the large number of arcs in the graph. In the analysis of real programs in the prior art, programs with complexity values in the hundreds are not at all uncommon. Some programs have even been seen with complexity values in the thousands.

It is an object of the present invention to provide a system and method for simplified computer display of computer program structure.

SUMMARY OF THE INVENTION

The structure of a computer program is represented in a directed graph file. This file is passed to a Hierarchical Graph Analysis process which (a) calculates the "node reach" for each node in the input graph, (b) determines the "node display threshold" for the graph, and (c) transforms the graph at the selected node display threshold. The transformed graph is then passed to a display process which displays the transformed graph on a display medium.

BRIEF DESCRIPTION OF THE DRAWINGS

FIG. 7 is a block diagram illustrating the Directed Graph created by the Analyze function for a sample input source program.

DESCRIPTION OF THE PREFERRED EMBODIMENT

Figure 1:
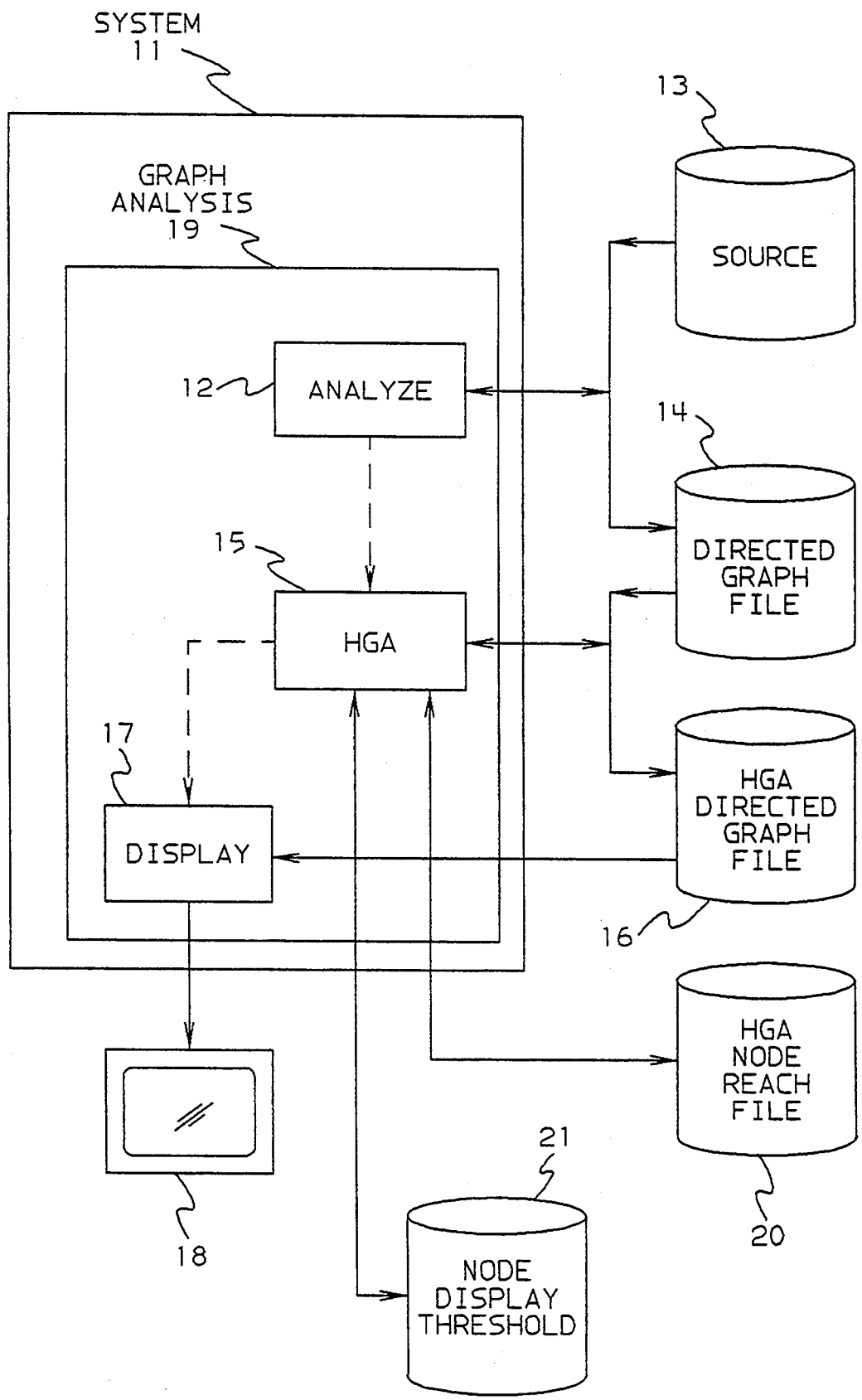
FIG. 1 is a block diagram illustrating the system structure for the present invention.

FIG. 1 is a system diagram illustrating the principal elements in the preferred embodiment of the present invention. A computer system 11 comprises a graph analysis function 19. The graph analysis function 19 comprises an Analyze function 12, a Hierarchical Graph Analysis (HGA) function 15, and a Display function 17. Analyze function 12 receives source code input from file 13, and produces Directed Graph file 14; this file comprises a function list file, and a function call file. HGA function 15 receives input from Directed Graph file 14, creates HGA Node Reach file 20 and determines Node Display Threshold 21, and produces HGA Directed Graph 16. Display function 17 accepts input from HGA Directed Graph file 16, and produces output on display device 18.

Figure 2:
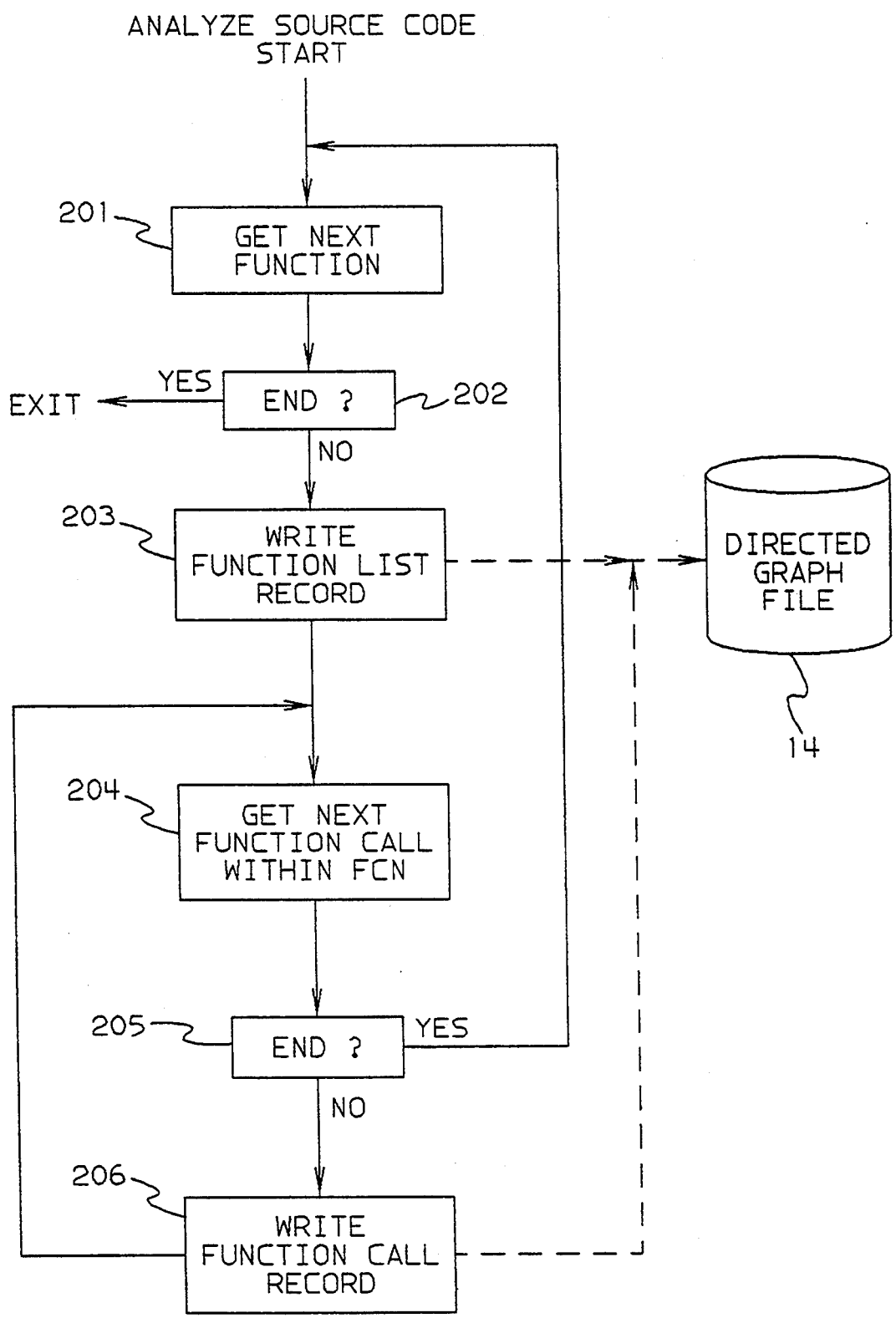
FIG. 2 is a flowchart illustrating control flow for the Analyze Source Code process in the present invention.

FIG. 2 is a flowchart illustrating control flow for the Analyze function 12. For each source program to be analyzed 13, the source code is scanned until the beginning of a program function definition (Function X) is reached 201. If the end of the source is reached 202, the Analyze function is exited; if not, a function list record is written 203 to the function list file within Directed Graph file 14. (This is accomplished by writing a record of the following format: ProgramFunction(FunctionX).)

Next, the function definition for Function X within source 13 is scanned 204 for a function call (call to another function—Function Y) within the definition. If no subsequent function call is encountered 205, processing continues at 201 with a search for the next function; if a subsequent function call is encountered, a function call record is written 206 to the function call list file within Directed Graph file 14. (This is accomplished by writing a record of the following format: ProgramFunctionCall(Function X, Function Y).) Processing then continues at 204 with a search for another function call within the current function definition.

After the processing of FIG. 2, the Function Call List file will contain a list of the calls between program functions in the source code program analyzed, and the Function List file will contain a list of all program functions in the source code program analyzed. FIG. 7 illustrates a sample Directed Graph file 702 (comprising Function List file 703 and Function Call List file 704)

created by application of this Analyze process to Sample Source Code file 701. The Function List file will be alternately termed the "node set", comprising as it does the functions (programs) that will be displayed as "nodes" in the ultimate graph display; and the Function Call List file will be alternately termed the "arc set" comprising as it does the arcs (links between nodes and called functions) in the ultimate graph display.

Figure 3:
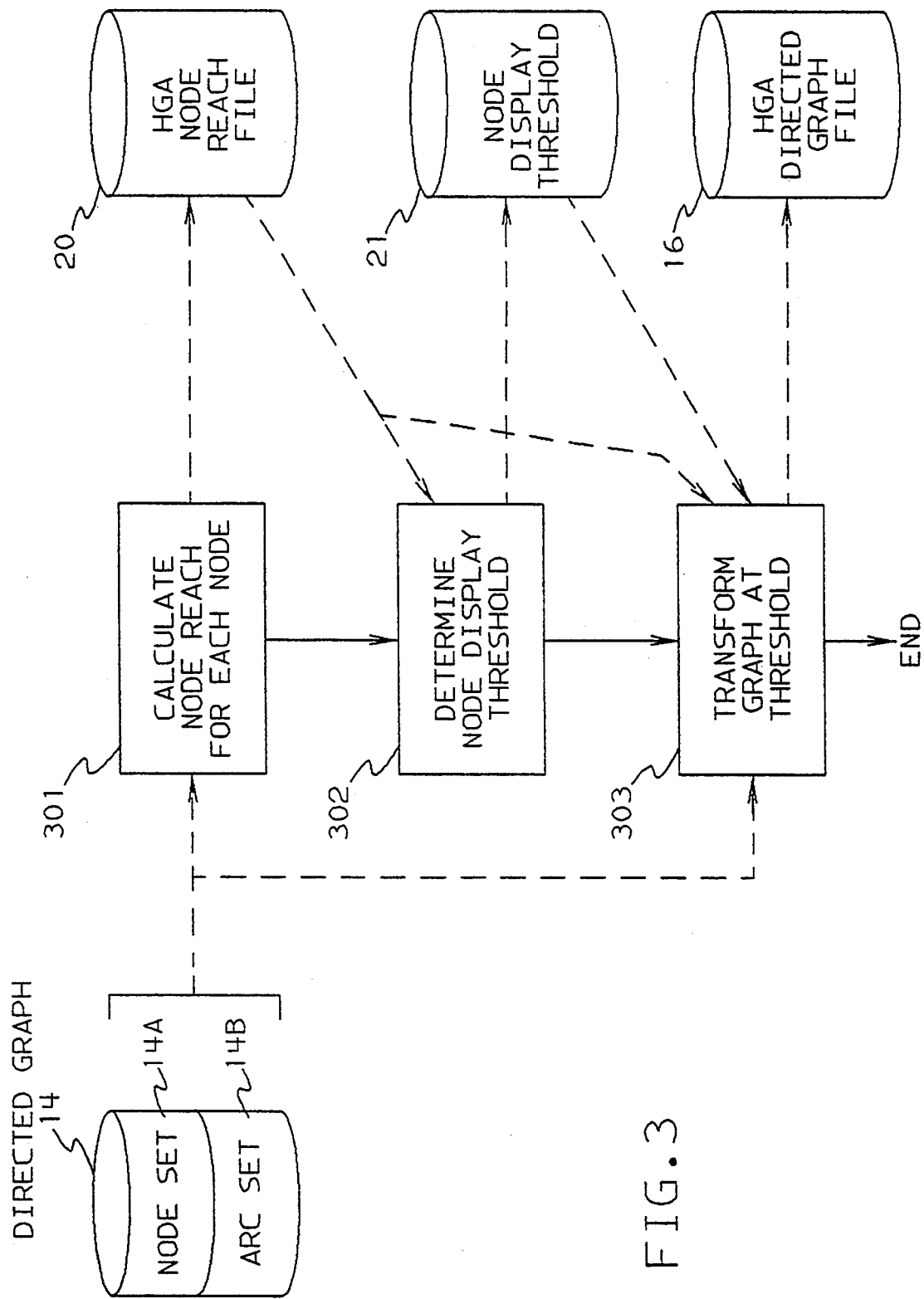
FIG. 3 is a flowchart illustrating control flow for the Hierarchical Graph Analysis (HGA) function.

FIG. 3 illustrates the major steps in performing the Hierarchical Graph Display (HGA) function. First, the "node reach" is calculated 301 for each node in the graph. This processing is described in more detail in FIG. 4 and the accompanying text below. Next, 302, the "Node Display Threshold" for the Graph is determined. This process is described in FIG. 5 and the accompanying text below. Finally, the graph is transformed 303 to an "HGA Directed Graph" 16 consistent with the Node Display Threshold determined at 302. This process is described in more detail in FIG. 6 and the accompanying text below. The HGA Directed Graph 16 will be a subset of the Directed Graph 14, and will be used by display function 17 for the final display on output device 18.

Figure 4:
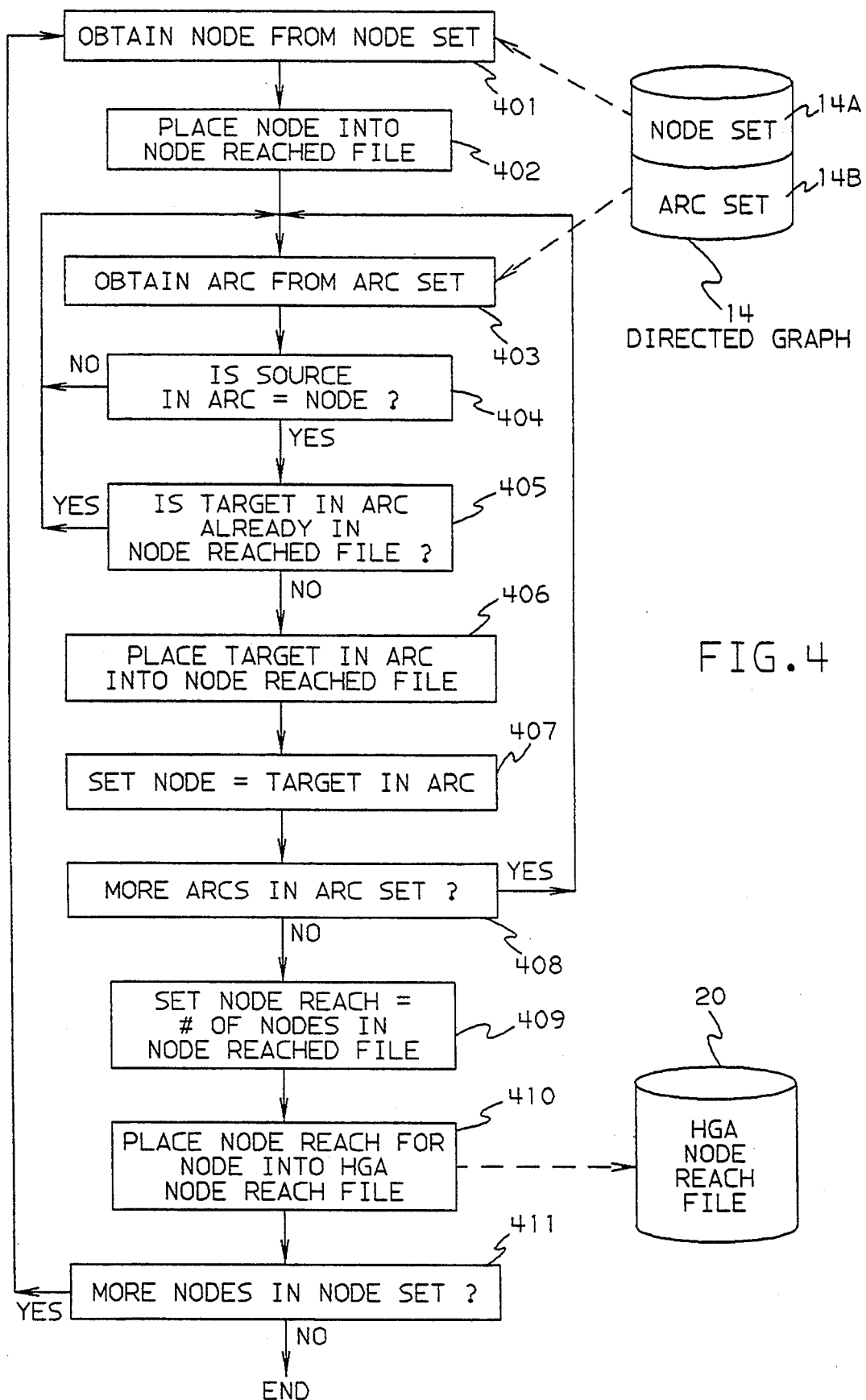
FIG. 4 is a flowchart illustrating control flow for the Node Reach Calculation function.

FIG. 4 illustrates the process of calculating a Node Reach for each Node in the graph. At the end of this process every node in the graph will have a Node Reach value determined for it. Each Node Reach value will be in the range of one to the number of nodes in the original graph. The Node Reach value will be equal to one if the given node, NodeX, has no outgoing arcs to any other nodes in the graph (other than to NodeX). The maximum Node Reach for a given node will be equal to the number of nodes in the graph. This will occur when there is a path from the given node, NodeX, to every one of the other nodes in the graph.

At 401, a node is obtained from Node Set 14A for processing. This node is placed 402 into a temporary file (Node Reached file) to represent the fact that the node under consideration is included in the set of nodes that may be reached starting from that same node. Next, 403, an arc is obtained from Arc Set 14B. This arc will be of the form (Source Node, Target Node). A test is made 404 whether the Source Node in the arc is the node under consideration. If not, another arc is obtained 403; if so, a test is made 405 whether the associated Target Node is already in the Node Reached file. If it is, another arc is obtained 403; if not, the associated Target Node is placed 406 into the Node Reached file. Next, 407, the node currently under consideration is set equal to the associated Target Node. Then a test is made 408 whether more arcs remain in Arc Set 14B. If so, processing continues again at 403 as already explained; if not, 409, the Node Reach is set equal to the total number of nodes then in the temporary Node Reached file, and that Node Reach value is placed 410 into the HGA Node Reach File 20 together with its associated node. Then a test is made 411 whether more nodes remain to be considered in Node Set 14A. If so, processing continues at 401 as explained; if not, a Node Reach value has been calculated for each node, and processing ends.

Figure 5A:
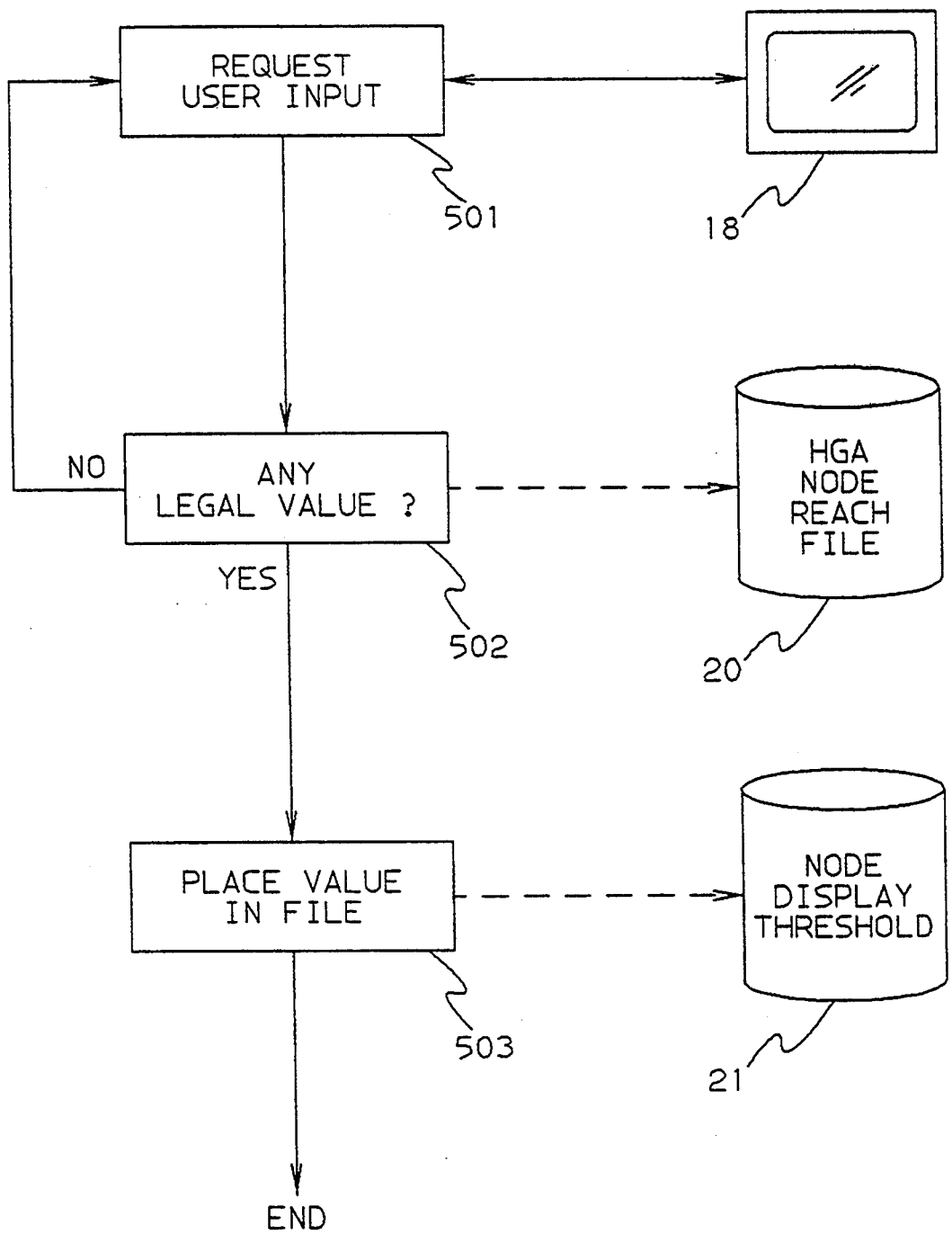
FIG. 5A and 5B are flowcharts illustrating control flow for the Determine Node Reach Display Threshold function.
Figure 5B:
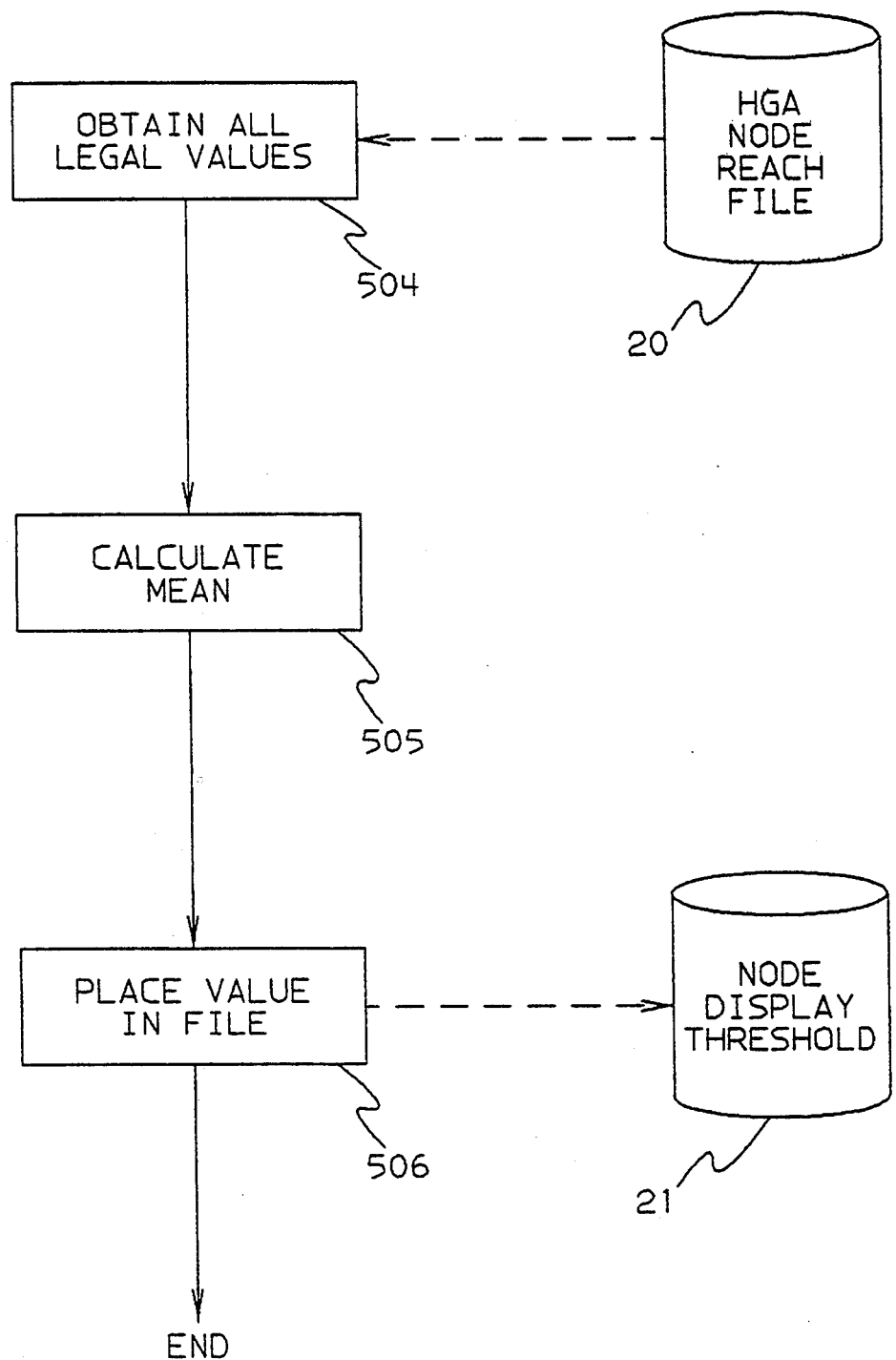

FIGS. 5A and 5B illustrate the process of determining the Node Reach Display Threshold 21 for the graph. This Threshold may be determined in one of two ways, depending on whether or not the graph display function embodiment selected allows direct end user interaction.

If end user interaction is desired, then the end user may set the node display threshold value. In a preferred embodiment this form of end user interaction is combined with a dynamic display medium such as computer monitor 18. In this case the end user may iteratively set the node display threshold to different values, permitting the user to see as much detail as desired for the particular program understanding task at hand. This process is illustrated in FIG. 5A. At 501, user input of a threshold value is requested. A test is then made 502 whether the input value is "legal" by comparing it against the set of values in the HGA node reach file 20. If the input value is not one of the values in that file, a substitute value is again requested 501; if the input value is permissible, the value is set as the Node Display Threshold 21 to be used by display function 17. (Note that display function 17 is a conventional step—many tools exist for performing graph display on a computer display—e.g., Bachman Analyst/Re-engineering tool, by Bachman Information Systems, Inc.)

If end user interaction is not desired, then a static method for selecting the node display threshold is required. In a preferred embodiment the average node reach for a given graph may be used as the node display threshold. FIG. 5B illustrates this process. At 501, all node reach values associated with the HGA graph are read from the HGA Node Reach file 20. The mean value of this set of numbers is calculated at 505. This mean value (rounded to the nearest integer) is set 506 as the Node Display Threshold 21 to be used by display function 17.

Figure 6:
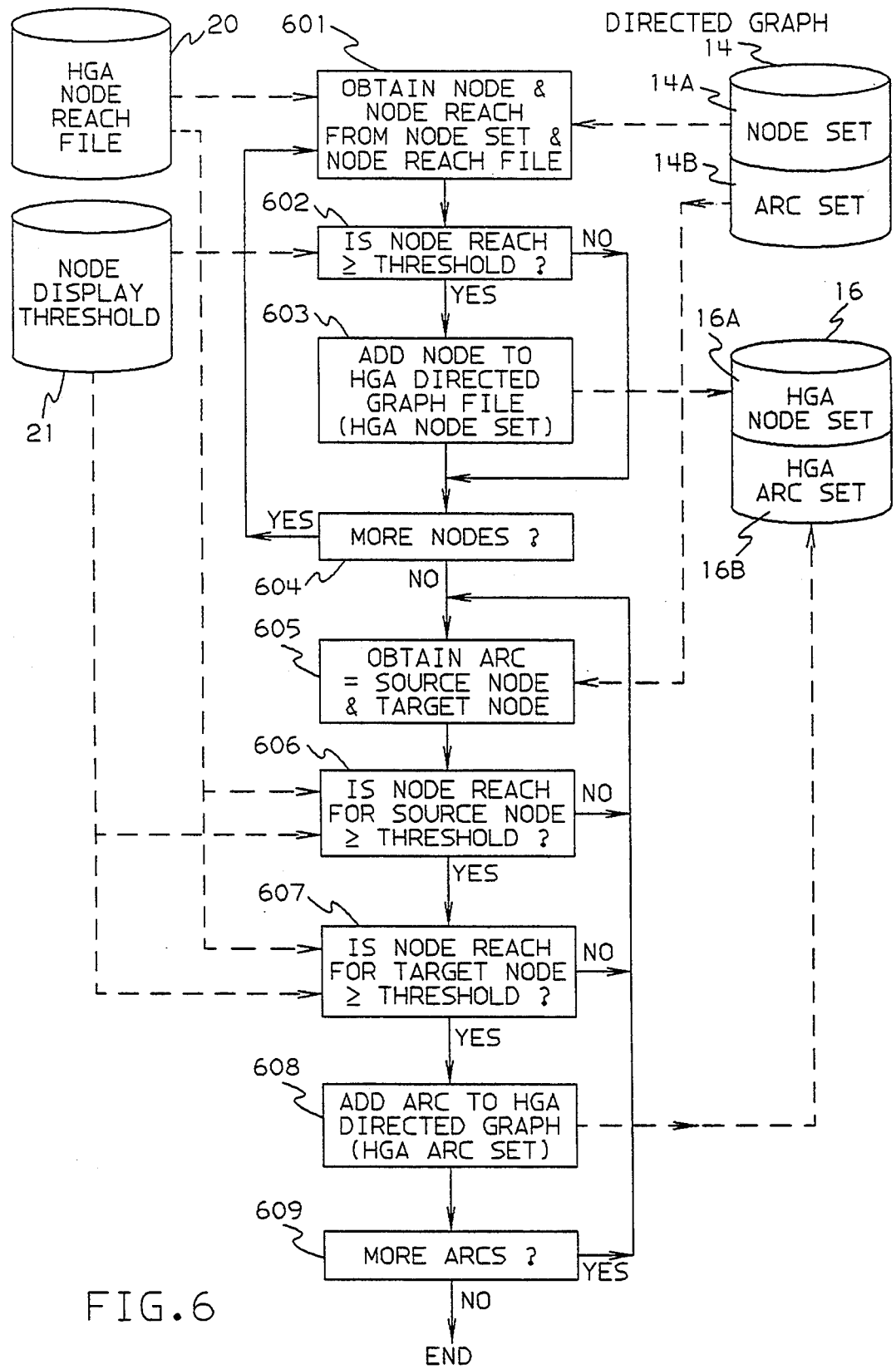
FIG. 6 is a flowchart illustrating control flow for the Graph Transformation function.

FIG. 6 illustrates the process of transforming Directed Graph 14 into HGA Directed Graph 16 at the Node Reach Display Threshold 21 calculated for the graph as illustrated in FIG. 5. At 601, a node is obtained from Node Set 14A, and its associated node reach is obtained from HGA node reach file 20. A test is then made 602 whether the associated node reach is greater than or equal to the node display threshold 21. If it is not, the node will not be displayed (it is not added to the HGA Directed Graph File), and processing continues as will be explained below at 604; if it is greater than or equal to the threshold, the node is added to the HGA Directed Graph file 16 (HGA Node Set 16A). Then a test is made 604 whether more nodes remain to be processed. If so, processing resumes as explained for step 601; if not, each arc link in the Directed Graph 14 is processed as follows: an arc to be processed is obtained 605 from Arc Set 14B. The arc is of the form (Source Node, Target Node). A test is made 606 if the node reach associated with the Source Node (obtained from HGA node reach file 20) is greater than or equal to the node display threshold 21. If not, a new arc is obtained 605; if it is greater than or equal to the threshold, a test is made 607 if the node reach associated with the Target Node (also obtained from the HGA node reach file 20) is greater than or equal to the node display threshold 21. If not, a new arc is obtained 605; if it is greater than or equal to the threshold, the arc under consideration is added to the HGA Arc Set portion 16B of HGA directed graph 16. (Note that HGA directed graph 16 comprises HGA Node Set 16A and HGA Arc Set 16B.) Then a test is made 609 if more arcs remain to be processed. If not, processing ends; if more remain, another arc is obtained as described for step 605, and processing continues there.

While the preferred embodiment of the present invention has been described, it will be understood by those skilled in the art, both now and in the future, that improvements may be made which fall within the scope of the claims which follow. These claims should be construed to maintain the proper protection for the invention first disclosed.

I claim:

1. A system for displaying structure of a source computer program comprising:
   a) an output display;
   b) graph analysis means for analyzing said source computer program, said graph analysis means comprising:
      i) analysis means for transforming said source computer program into a directed graph file comprising a function list file and a function call list file, said function list file comprising one or more nodes, said function call list file comprising one or more arcs;
      ii) hierarchical graph analysis (HGA) means for transforming said directed graph file into an HGA directed graph file;
      iii) display means for displaying said HGA directed graph file on said output display.

2. The system of claim 1 in which said HGA means comprises:
   a) node reach means for producing a node reach file comprising a node reach value for each of said one or more nodes;
   b) threshold determination means for producing a node display threshold value for said directed graph file;
   c) graph transformation means for producing a HGA directed graph corresponding to said directed graph as modified by said node display threshold value.

3. The system of claim 2 in which said threshold determination means comprises means for soliciting from a user and accepting from said user, said node display threshold value.

4. The system of claim 2 in which said threshold determination means comprises algorithmic means for calculating said node display threshold value using as input said node reach file.

5. A method for operating a computer system to display a structure of a source computer program, said method comprising the steps of:
   a) transforming said source computer program into a directed graph file comprising a function list file and a function call list file, said function list file comprising one or more nodes, said function call list file comprising one or more arcs;
   b) transforming said directed graph file into an hierarchical graph analysis (HGA) directed graph file; and
   c) displaying said HGA directed graph file on an output display of said computer system.

6. The method of claim 5 in which said step of transforming said directed graph file into said HGA directed graph file comprises the steps of:
   a) producing a node reach file comprising one or more node reach values, each of said one or more node reach values being associated with a single one of said one or more nodes in said function list file;
   b) producing a node display threshold value for said directed graph file;
   c) producing an HGA directed graph by transforming said directed graph using said node display threshold value, said transforming being accomplished by including one of said one or more nodes in said HGA directed graph only if said one of said one or more nodes has an associated one of said one or more node reach values having a first particular relation to said node display threshold value.

7. The method of claim 6 in which said first particular relation is "greater than or equal to".

8. The method of claim 6 in which said step of producing said node display threshold value comprises the step of soliciting from a user and accepting from said user, said node display threshold value.

9. The method of claim 8 further comprising the steps of soliciting from said user, a new node display threshold value after said step of displaying said HGA directed graph file and, if said user provides said new node display threshold value, using said new node display threshold value to transform said directed graph file into a new HGA directed graph file, and then displaying said new HGA directed graph file on said output display.

10. The method of claim 6 in which said step of producing said node display threshold value comprises the step of algorithmically computing said node display threshold value from said node reach file.

11. The method of claim 10 in which said step of algorithmically computing said node display threshold value comprises setting said node display threshold value equal to a mean of all of said one or more node reach values.

12. The method of claim 6 in which each of said one or more arcs comprises a source node and a target node, and in which said step of producing an HGA directed graph by transforming said directed graph using said node display threshold value further comprises the step of including one of said one or more arcs in said HGA directed graph only if both said source node and said target node comprising said one of said one or more arcs have an associated node reach value having a second particular relation to said node display threshold value.

13. The method of claim 12 in which said second particular relation is "greater than or equal to".

14. The system of claim 1, wherein each of said one or more nodes has an associated node reach value and wherein said HGA means uses the associated node reach value of at least one of said one or more nodes in transforming said directed graph file into said HGA directed graph file.

15. The method of claim 5, wherein each of said one or more nodes has an associated node reach value and wherein said transforming step (b) uses the associated node reach value of at least one of said one or more nodes in transforming said directed graph file into said HGA directed graph file.

* * * * *